US006801592B1

United States Patent
Christensen (10) Patent No.: US 6,801,592 B1
(45) Date of Patent: Oct. 5, 2004

(54) METHOD AND A CIRCUIT FOR RETIMING A DIGITAL DATA SIGNAL

(75) Inventor: Steen Bak Christensen, Skovlunde (DK)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/577,000

(22) Filed: May 24, 2000

Related U.S. Application Data (63) Continuation-in-part of application No. PCT/DK99/00647, filed on Nov. 23, 1999.

(30) Foreign Application Priority Data

Nov. 24, 1998 (DK) .......................................... 1998 01542

(51) Int. Cl.[7] .............................................. H03D 3/24
(52) U.S. Cl. ........................ 375/375; 375/376; 375/355; 375/362; 327/147; 327/156
(58) Field of Search ................................ 375/376, 355, 375/362, 364, 373, 375; 327/141, 144, 146, 147, 149, 155, 156, 158, 161

(56) References Cited

U.S. PATENT DOCUMENTS

| 4,339,823 | A | | 7/1982 | Predina et al. | |
|---|---|---|---|---|---|
| 4,707,842 | A | | 11/1987 | Fischer | |
| 5,539,344 | A | | 7/1996 | Hatakenaka | |
| 5,835,544 | A | * | 11/1998 | Yoshimura et al. | ......... 375/376 |
| 5,949,281 | A | * | 9/1999 | Sharpe | ......................... 329/325 |
| 6,026,134 | A | * | 2/2000 | Duffy et al. | ................ 375/376 |
| 6,031,428 | A | * | 2/2000 | Hill | .............................. 331/11 |
| 6,072,344 | A | * | 6/2000 | Larsson | ....................... 327/156 |
| 6,097,560 | A | * | 8/2000 | Tanaka et al. | ................ 360/51 |
| 6,208,181 | B1 | * | 3/2001 | Johnson | ....................... 327/156 |
| 6,229,865 | B1 | * | 5/2001 | Yeo | ............................. 375/375 |
| 6,366,628 | B1 | * | 4/2002 | Su et al. | ...................... 375/355 |

FOREIGN PATENT DOCUMENTS

| DE | 3012075 A1 | 10/1981 |
|---|---|---|
| EP | 0429912 A2 | 6/1991 |
| EP | 0663744 A1 | 7/1995 |
| GB | 2233177 A | 1/1991 |

* cited by examiner

Primary Examiner—Jean B. Corrileus
Assistant Examiner—Qutub Ghulamali
(74) Attorney, Agent, or Firm—Blakely, Sokoloff, Taylor & Zafman LLP (57) ABSTRACT

By application of a method and a circuit for retiming one or several digital data signal(s) ($D_{in}$) each consisting of a number of successive bits, wherein the data signal is sampled by an internal clock signal ($Ck_{int}$) generated from an external clock signal ($Ck_{ref}$), the internal clock signal ($Ck_{int}$) is phase locked to the data signal ($D_{in}$) so that the latter is sampled approximately in the centre of every bit. By generating the internal clock signal from the external clock signal, and at the same time phase locking it to the data signal, the internal clock signal will automatically adjust itself so that the data signal is sampled at the appropriate point in time, i.e. in the centre of the bit period. As a result, there are no strict requirements as to the synchronisation between the data signal and the clock signal, and an individual adjustment of the synchronisation in preceding circuits is thus avoided.

16 Claims, 4 Drawing Sheets

METHOD AND A CIRCUIT FOR RETIMING A DIGITAL DATA SIGNAL

This application is a Continuation-In-Part of PCT International Application No. PCT/DK99/00647 filed on Nov. 23, 1999, which designated the United States and on which priority is claimed under 35 U.S.C. § 120, the entire contents of which are hereby incorporated by reference.

TECHNICAL FIELD OF THE INVENTION

The invention relates to a method for retiming one or several digital data signal(s) each consisting of a number of successive bits, wherein the data signal(s) is/are sampled by an internal clock signal generated from an external clock signal, and a circuit for retiming such digital data signal(s).

BACKGROUND OF THE INVENTION

When transmitting rapid digital data signals in the form of a number of successive bits or a bit stream, e.g. from a laser driver to an optical transmission link, it is usually necessary to perform a so-called retiming of the data signal(s), wherein the individual bits are synchronised with a clock signal. At very high data rates, the individual bit periods are, naturally, very short; the bit period at 2.5 GHz is, e.g., only 400 ps. Hence, in every bit the digital data signal is stable only for a short period, and therefore it is important that the incoming data signal is sampled quite accurately in the centre of the bit period, or in the centre of the eye diagram as it is also termed. Since the temporal characteristic of the data signal as well as the clock signal is sensitive to e.g. process and temperature variations, it is difficult prior to the sampling to ensure that the synchronisation between them is sufficient for the sampling actually to be effected approximately in the centre of the bit period, or at least it places heavy demands on the mutual synchronisation between the clock signal and the digital data signal(s).

Therefore, it has so far been necessary in the preceding circuits to ensure that these requirements are met. However, usually this requires an adjustment of said circuit, and since this adjustment is to be performed separately for each individual circuit during production, it is a process that makes the product considerably more expensive and more complicated.

SUMMARY OF THE INVENTION

Thus, it is an object of the invention to set out a method of the above type, wherein there are no strict requirements as to the synchronisation between the data signal(s) and the clock signal, and wherein an individual adjustment of the synchronisation in the preceding circuits is thus avoided.

According to the invention this is achieved by a method of retiming one or several digital data signal(s) by a retiming circuit, each digital data signal comprising a number of successive bits, the method comprises the steps of:

providing an external clock signal to the retiming circuit,
providing a digital data signal of the one or several digital data signal(s) to the retiming circuit,
deriving an internal clock signal from the external clock signal, the internal clock signal being synchronous to the external clock signal,
detecting a phase difference between the digital data signal and the internal clock signal,
generating a control signal indicating the phase difference,
adjusting a phase of the internal clock signal with respect to a phase of the digital data signal based on the control signal, and
sampling the digital data signal(s) by the internal clock signal.

Hereby, the internal clock signal is phase locked to the digital data signal in such a way that the latter is sampled approximately in the centre of each bit of the number of successive bits. By generating the internal clock signal based on the external clock signal so that the internal clock signal is synchronous to the external clock signal, and at the same time phase locking the internal clock signal to the data signal, the internal clock signal will automatically adjust itself so that the data signal is sampled at the appropriate point in time, i.e. in the centre of the bit period. As a result, there are no longer requirements as to the phase position of the external clock signal in relation to the data signal.

According to an embodiment of the invention, the control signal may be produced as a measure of the phase difference between the digital data signal and the internal clock signal, and the phase lock may be performed by means of this control signal.

Furthermore, the internal clock signal may be produced by delaying the external clock signal, said delay being controlled by said control signal. Alternatively, the internal clock signal may be derived from the external clock signal by delaying the internal clock signal in dependence of the control signal. A relatively simple solution is thus obtained in that the desired effect can be achieved with just one component, i.e. a controllable delay unit. A prerequisite for this solution is, however, that the external clock signal already has the same frequency as the data signal, and any jitter in the clock signal will be transferred to the retimed data signal.

Alternatively, the internal clock signal may be frequency locked to the external clock signal by means of a frequency locked loop, wherein a controlled oscillator produces the internal clock signal controlled by a steering signal which is produced as a measure of a frequency variation between the internal and the external clock signals, and said control signal may be combined with said steering signal before the latter is provided to the oscillator. By using a frequency locked loop for generating the internal clock signal, the latter may be generated largely without jitter, causing the retimed data signal to be largely free of jitter, as well.

By low-pass filtering the steering signal with a first bandwidth before it is provided to the controlled oscillator, and low-pass filtering the control signal with a second bandwidth before it is combined with the steering signal, wherein said second bandwidth is narrower than said first bandwidth, the change of the control signal will be substantially slower than that of the frequency locked loop itself. Thus, one may ensure that the internal clock signal is in the correct phase position with respect to the data signal without affecting the desired frequency locking to the external clock signal.

Another alternative is to phase lock the internal clock signal to the external clock signal by means of a phase locked loop comprising a phase frequency detector (PFD), a first low pass filter with a first bandwidth and a controlled oscillator, such as a voltage controlled oscillator, similar to the frequency locked loop mentioned above. By generating the internal clock signal using a phase locked loop, the internal clock signal may be generated largely without jitter, causing the retimed data signal to be largely free of jitter, as well.

The frequency of at least one of the internal clock signal and the external clock signal, respectively, may be divided down prior to the production of the steering signal. Dividing down the internal clock signal when it is generated by means of a frequency locked loop allows the frequency lock operation to be performed at a frequency lower than that of the internal clock signal. Dividing down the external clock signal allows this signal as well to have a frequency higher than that at which the frequency lock operation is performed. Thus, performing one (or both) of these divisions also allows the frequency of the internal clock signal to differ from the frequency of the external clock signal.

As mentioned, the invention further relates to a circuit for retiming one or several digital data signal(s) each consisting of a number of successive bits, the circuit being designed to generate an internal clock signal from an external clock signal, and for sampling the data signal by means of said internal clock signal. The retiming circuit comprises phase comparison means adapted to generate a control signal indicating a phase difference between a digital data signal of the one or several digital data signals and an internal clock signal, an internal clock unit adapted to derive the internal clock signal from the control signal and an external clock signal provided to the retiming circuit, the internal clock signal being synchronous to the external clock signal, data sampling means adapted to receive the one or several digital data signal(s) and to sample the digital data signal(s) by the internal clock signal, whereby a phase of the internal clock signal is adjusted with respect to a phase of the digital data signal(s) based on the control signal provided to the internal clock means.

Figure 2:
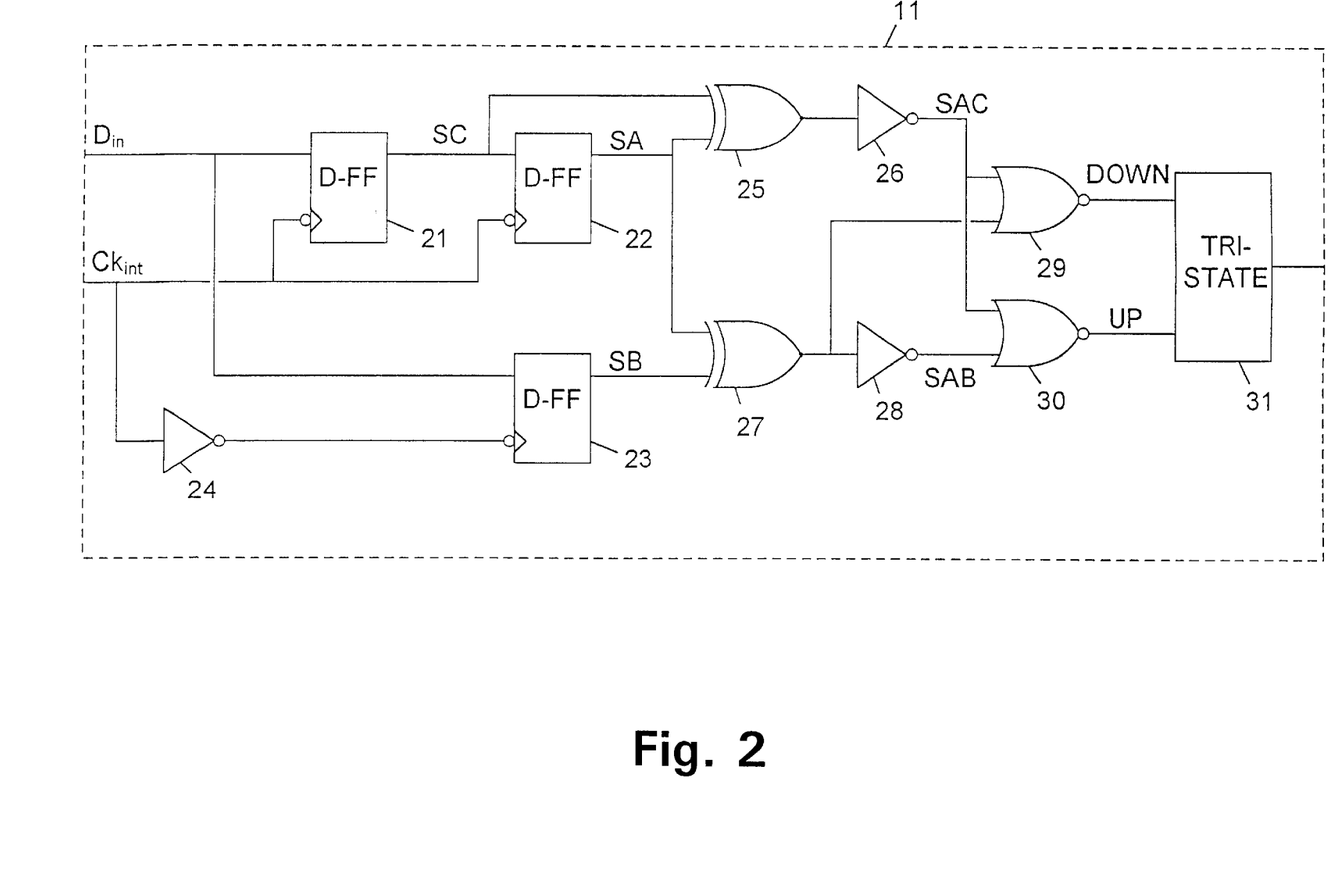
FIG. 2 shows an example of the structure of a phase detector for use in the circuit of FIG. 1.

The phase comparison means may comprise any means capable of providing a control signal based on the detected phase difference between the digital data signal of the one or several digital data signal(s) and the internal clock signal, the phase comparison means may comprise a phase detector, preferably a phase detector as shown in FIG. 2, or a phase frequency detector, etc, The data sampling means may be any means adapted to receive the one or several digital data signal(s) and to sample the digital data signal(s) by the internal clock signal, the data sampling means may thus comprise one or more flip flop(s), a multiplexer, etc.

The fact that the circuit is designed to phase lock the internal clock signal to the data signal so that the latter is sampled approximately in the centre of every bit results in the internal clock signal being able to adjust itself automatically so that the data signal is sampled at the correct point in time, i.e. in the centre of the bit period. As a result, there are no longer requirements as to the phase position of the external clock signal in relation to the data signal.

In an appropriate embodiment of the invention, the circuit is designed to perform the phase lock of the internal clock signal to the data signal by means of a control signal expressing the phase difference between the data signal and the internal clock signal.

The circuit may comprise a controllable delay unit designed in such a way that said control signal may control it, and be designed to provide the internal clock signal by letting the external clock signal pass said delay unit. A relatively simple solution is thus obtained in that the desired effect can be achieved with just one component, i.e. a controllable delay unit. A prerequisite for this solution is, however, that the external clock signal already has the same frequency as the data signal, and any jitter in the clock signal will be transferred to the retimed data signal.

The retiming circuit may comprise a phase locked loop or a frequency locked loop adapted to receive and lock onto the external clock signal to provide the internal clock signal.

The phase or frequency locked loops may comprise a first low-pass filter with a first bandwidth, and the phase or frequency locked loops may, further, comprise a second low-pass filter with a second bandwidth adapted to filter the control signal prior to being applied to a node of the phase or frequency locked loops. In a preferred embodiment the first bandwidth is larger, such as between 10 and 20 times larger, than the second bandwidth.

In one preferred embodiment, the circuit may, thus, comprise a phase locked loop or a frequency locked loop, by means of which the internal clock signal may be phase locked or frequency locked to the external clock signal, the phase or frequency locked loop comprising a phase frequency detector unit which is designed to produce a steering signal as a measure of a phase variation or a frequency variation between the internal and external clock signals and a controlled oscillator which is designed to produce the internal clock signal controlled by the steering signal, and further comprise means for combining said control signal with said steering signal before the latter is provided to the oscillator. By use of a phase locked loop or a frequency locked loop for generating the internal clock signal, the latter may be generated largely without jitter, causing the retimed data signal to be largely free of jitter, as well.

The circuit may comprise a first low-pass filter with a first bandwidth for filtering the steering signal before it is provided to the controlled oscillator, as well as a second low-pass filter with a second bandwidth for filtering the control signal before it is combined with the steering signal, wherein said second bandwidth is narrower than said first bandwidth, whereby the control signal changes substantially slower than the frequency locked loop itself. Thus, one may ensure that the internal clock signal is in the correct phase position in relation to the data signal without affecting the desired phase or frequency lock to the external clock signal.

Furthermore, the circuit may comprise means for dividing down the frequency of at least one of the internal clock signal and the external clock signal, respectively, before they are provided to the oscillator. The circuit may for example comprise a first divider circuit arranged with a feed-back path of the phase locked loop or the frequency locked loop, the first divider circuit being adapted to divide a feed-back path loop signal by an integer ratio, K, whereby the frequency of the internal clock, signal which samples the digital data signal is multiplied by K with respect to the external clock.

Dividing down the internal clock signal when it is generated by means of a phase or frequency locked loop enables the phase lock or the frequency lock operation to be performed at a frequency lower than that of the internal clock signal. Dividing down the external clock signal allows this signal as well to have a frequency higher than that at which the phase or frequency lock operation is performed. Thus, the performance of one (or both) of these divisions also allows the frequency of the internal clock signal to differ from the frequency of the external clock signal.

In another preferred embodiment of the invention the one or several digital data signals may form part of a data bus carrying several associated digital data signals. The data sampling means may comprise one or several D-FFs being adapted to receive the internal clock signal to sample a respective digital data signal of the one or several digital data signal(s).

The retiming circuit may further comprise a multiplexer adapted to receive the several associated digital data signals and to generate an outgoing serial digital data signal from the several associated digital data signals, the multiplexer being clocked by a clock signal derived from the internal clock signal.

BRIEF DESCRIPTION OF THE DRAWING

The invention will be described in greater detail below with reference to the drawings in which.

DETAILED DESCRIPTION

The disclosed circuits hereunder are preferably integrated on a single or several integrated circuits. To support the required high-speed operation of the present circuits, logic gates and circuit blocks are preferably implemented as CML logic using bipolar transistors. The preferred process is a 2.0 μm Bipolar process suitable digital circuits operating within the frequency range of about 622 MHz to 10 GHz. The NPN transistors provided by this process have $f_T$ values of about 25 GHz. Alternatively, commercially available 0.13–0.25 μm CMOS processes with sufficiently fast transistors may be capable of being applied in some applications of the present invention, at least for circuits operating at the lower system frequencies.

Figure 1:
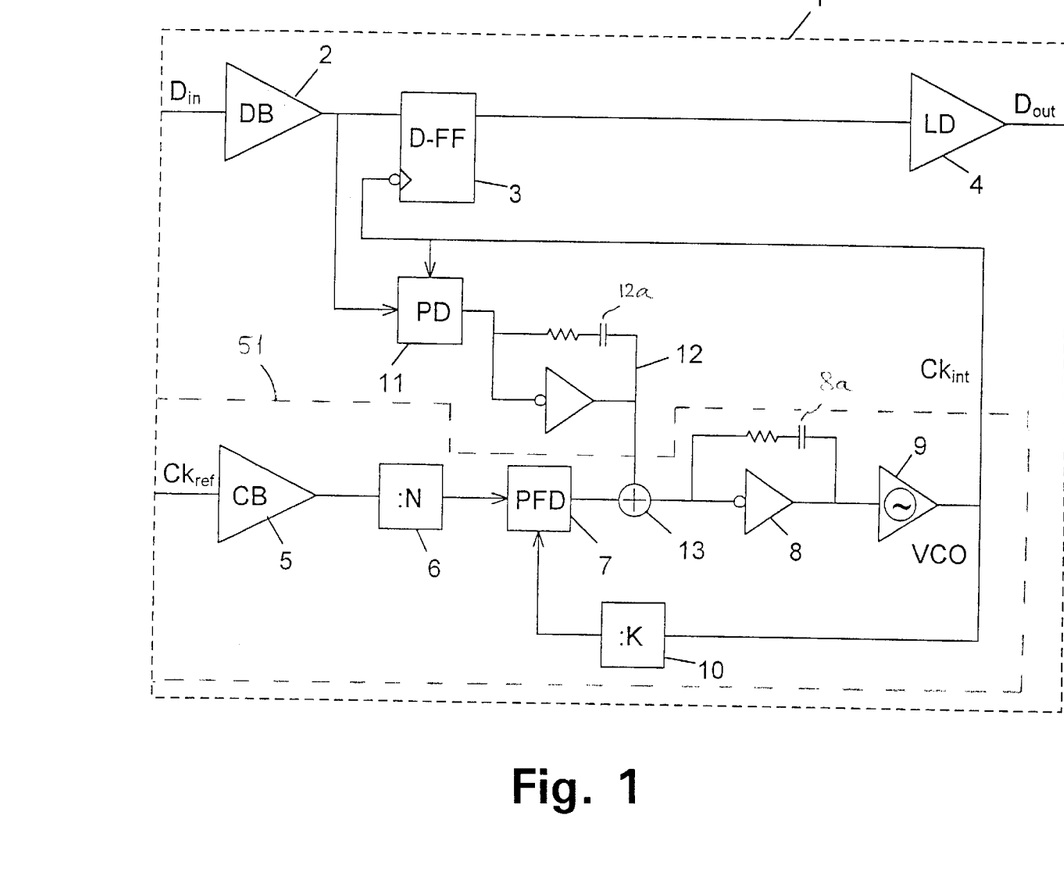
FIG. 1 shows a circuit according to a first embodiment of the invention.

FIG. 1 shows a circuit 1 according to the invention. The circuit shown is a laser driver circuit for driving a laser diode in an optical transmission link, wherein a so-called retiming of the data signal is performed in the laser driver circuit. Hence, the data signal is synchronised to a clock signal. Both a (digital and electric) data signal $D_{in}$ and a corresponding external clock signal $Ck_{ref}$ are received from a preceding circuit (not shown) which may typically form part of a node in an optical teletransmission system. This optical teletransmission system may operate in accordance with standard communications protocols SDH STM-1, SDH STM-4, SDH STM-16, SDH STM-64 and Ethernet GE 1.250 Gbit/s utilising data rates of about 155 MHz, 622 MHz, 2.5 GHz, 10 GHz and 1250 GHz, respectively.

In general terms, the retiming circuit at FIG. 1 comprises phase comparison means 11 adapted to generate a control signal indicating a phase difference between the digital data signal $D_{in}$ and an internal clock signal $Ck_{int}$. The internal clock signal $Ck_{int}$ is derived from the control signal and the external clock signal, so that a phase of the internal clock signal is adjusted with respect to a phase of the digital data signal, by an internal clock unit 51. The internal clock unit 51 comprises a phase locked loop or a frequency locked loop. On FIG. 3 an alternative embodiment is shown wherein the internal clock unit 51 comprises a controlled time delay unit 42. The internal clock signal is provided to data sampling means, such as flip-flop 3, wherein the digital data signal is sampled by the internal clock signal $Ck_{int}$. The phase of the internal clock signal is, thus, adjusted with respect to a phase of the digital data signal based on the control signal provided to the internal clock unit 51.

In FIG. 1, the data signal $D_{in}$ is led via a data buffer 2 to a flip-flop 3, in which the actual retiming is performed. The retimed data signal is then led to the laser driver 4, the output signal of which $D_{out}$ is connected to a laser diode (not shown). The circuit is designed for use at very high frequencies, i.e. frequencies in the GHz range, causing the bit period of the data signal to be very short. At 2.5 GHz the bit period is only 400 ps. Due to process and temperature variations, the temporal position of the data signal and the clock signal with respect to each other may vary, and this may be the case on the actual laser driver circuit as well as on the preceding circuits. Therefore, it is difficult to ensure that the data signal is actually retimed, i.e. sampled, in the centre of the bit period, or in the centre of the eye diagram as it is also termed.

The data signal is retimed by the data signal $D_{in}$ being sampled in the flip-flop 3 by an internally generated clock signal $Ck_{int}$ provided by a voltage-controlled oscillator which is frequency locked to the external clock signal $Ck_{ref}$. The clock signal $Ck_{ref}$ is led via a clock signal buffer 5 and a dividing circuit 6, which will be described in greater detail below, to a phase frequency detector 7, in which it is compared to the internal clock signal $Ck_{int}$ which may also be divided down in a dividing circuit 10. Any frequency difference between the two clock signals will cause an error signal at the output of the phase frequency detector 7, said error signal being provided as a steering signal via a low-pass filter 8 to the voltage-controlled oscillator 9. The clock signal $Ck_{int}$ produced by the oscillator 9 is then used in the flip-flop 3 for sampling the data signal $D_{in}$ which is thus retimed in such a way that it is synchronised with the clock signal $Ck_{int}$.

This part of the circuit is prior art and contributes to ensuring that the internal clock signal $Ck_{int}$, and thus the retimed data signal $D_{out}$, are frequency locked to the external clock signal $Ck_{ref}$. However, it does not ensure that the sampling of the data signal $D_{in}$ in the flip-flop 3 is performed at the correct point in time with respect to the data signal. As a consequence of the mentioned process and temperature variations, there may be a phase difference between the data signal $D_{in}$ and the clock signal $Ck_{ref}$, and due to the very short bit periods the data signal is stable for only a very short period, for which reason even a very small phase difference may result in the data signal not being sampled in the centre of the bit period where it is stable.

The invention rectifies this problem in that phase detector 11, the operation of which will be described in greater detail below, compares the internal clock signal $Ck_{int}$ with the data signal $D_{in}$ and produces a signal at its output, said signal being a measure of the phase difference between the two signals, and thus between the optimum sampling time and the actual sampling time. This offset signal is filtered in the low-pass filter 12 and is then added, in the summing point 13, to the error signal from the phase frequency detector 7 before the error signal is provided to the low-pass filter 8 in the original loop. This results in a phase change of the voltage-controlled oscillator 9, and thus of the sampling time. If the time constants of the two filters 8 and 12 are selected so that the low-pass filter 12 is much slower than the low-pass filter 8, the loop consisting of the phase detector 11, the filters 12 and 8 and the voltage-controlled oscillator 9 will adjust the internal clock signal $Ck_{int}$ so that the optimum sampling time is obtained.

If, e.g., the frequency of the internal clock signal $Ck_{int}$ is 2.5 GHz corresponding to a bit rate for the data signal of 2.5 Gbit/s and the external clock signal has the same frequency, it may be chosen also to have the comparison in the phase frequency detector 7 take place at this frequency. In that case the dividing circuits 6 and 10 may be omitted, the entire clock signal circuit consequently running at 2.5 GHz. However, it will often be expedient to have the comparison in the phase frequency detector 7 take place at a second (lower) frequency which is used as system frequency elsewhere in the transmission system. In the case of e.g. an SDH system, it would typically be desirable to carry out the comparison at a frequency of 77.76 MHz already used as internal clock signal frequency for a first order SDH system (i.e. an STM 1 frame) with the data rate 155.52 Mbit/s. In that case the dividing circuit 10 will be designed to divide the frequency down by a factor 32. In this situation, the external clock signal frequency $Ck_{ref}$ will most often be 77.76 MHz, for which reason the dividing circuit 6 could also be omitted. The dividing circuit 6 enables the frequency of the external clock signal $Ck_{ref}$, as well, to be higher than the frequency at which the phase frequency detector compares the two clock signals. If the external and internal clock signals have the same frequency, the dividing circuits 6 and 10 will be designed to divide down by the same factor, but there may just as well be two different frequencies, different division factors being used.

FIG. 2 shows an example of the structure of the phase detector 11. As mentioned above, the phase detector 11 compares the internal clock signal $Ck_{int}$ to the data signal $D_{in}$ and provides a signal at its output, said signal being proportional to the phase difference between the two signals, and thus between the optimum sampling time and the actual sampling time. This is effected by the internal clock signal $Ck_{int}$ being used for sampling the data signal $D_{in}$ in three flip-flops 21, 22, 23 at three different points in time. If the type of flip-flop used is designed to sample on a positive clock signal edge, the outputs of the two flip-flops 21 and 22 will display the present and preceding sampling value of the data signal, respectively. The present value is termed sample C (SC), whereas the preceding value is termed sample A (SA). The delay in flip-flop 21 is taken to be sufficient to ensure that a new sampling value at the output (SC) caused by a positive clock signal edge does not appear until after flip-flop 22 has performed its sampling caused by the same clock signal edge. If this is not the case, an additional delay element must be inserted between the two flip-flops.

Due to the inverter 24, flip-flop 23 will sample the data signal on the negative edge of the clock signal, resulting in a sampling value (sample B, SB) exactly in between the two others, i.e. about the time when the transition from the preceding to the present bit period takes place, the positive and negative half-periods being taken to be of equal length. If this is not the case, the inverter 24 may be replaced by a delay circuit with a delay corresponding to half a clock signal period.

Thus, at the outputs of the three flip-flops, three successive sampling values will be represented, i.e. SA which was performed approximately in the centre of the preceding bit period, SB which was performed about the time when the transition from the preceding to the present bit period takes place, and SC which was carried out approximately in the centre of the present bit period. A signal SAC is produced by means of an XOR circuit 25 and a subsequent inverter 26, said signal being, logically, "1" if the sampling values SA and SC are identical, and being, logically, "0" if they are different, i.e. there has been a shift from the preceding to the present bit period. Similarly, a signal SAB is produced by means of an XOR circuit 27 and a subsequent inverter 28, said signal being, logically, "1" if the sampling values SA and SB are identical, and being, logically, "0" if they are different.

Subsequently, two NOR circuits 29 and 30 produce two signals, UP and DOWN. If SAC is logically "1", corresponding to the-sampling values SA and SC being identical, both signals UP and DOWN will logically be "0" irrespective of the value of SAB, the sampling value SB being insignificant, since it is impossible, in this situation, to extract information about the position of the sampling time.

If, on the other hand, SAC is logically "0", corresponding to a shift from the preceding to the present bit period having taken place, the signals UP and DOWN are determined by the signal SAB. The signal DOWN will logically be "1" if SAB is "1", corresponding to the sampling values SA and SB being identical as a result of the shift from the preceding to the present bit period having taken place later than the negative edge of the clock signal. In that case the clock signal is too early as compared to the optimum sampling time, i.e. the clock signal frequency (i.e. the frequency of the clock signal $Ck_{int}$) is too high, and the signal DOWN signals that the clock signal frequency should be reduced. If, on the other hand, SAB is "0", the signal UP will logically be "1", corresponding to the sampling values SA and SB being different as a result of the shift from the preceding to the present bit period having taken place prior to the negative edge of the clock signal. In that case the clock signal is too late as compared to the optimum sampling time, i.e. the clock signal frequency (i.e. the frequency of the clock signal $Ck_{int}$) is too low, and the signal UP signals that the clock signal frequency should be increased.

In order to convert the two signals UP and DOWN to a single signal which may be led via the filter 12 to the summing point 13, the two signals are led to a tristate circuit or a charge pump 31. When both signals are "0", the output of the circuit 31 is in a state of high impedance (tristate) so that the summing point 13 is not affected. When the signal UP is logically "1", the circuit 31 provides a positive charging current which is led via the filter 12 to the summing point 13 and thus increases the control voltage applied to the voltage-controlled oscillator 9 so that the frequency of the internal clock signal $Ck_{int}$ is increased. Similarly, when the signal DOWN is logically "1", the circuit 31 provides a negative charging current which is drawn, via the filter 12, from the summing point 13 and thus reduces the control voltage applied to the voltage-controlled oscillator 9 so that the frequency of the internal clock signal $Ck_{int}$ is reduced. Consequently, the clock signal $Ck_{int}$ will be adjusted on an ongoing basis so that sampling B will always take place precisely at the transition time, and sampling C consequently in the centre of the bit period, at the same time as $Ck_{int}$ is still frequency locked to the external clock signal $Ck_{ref}$. The shown capacitor 12a of the low-pass filter 12 can either be an internal capacitor integrated on a silicon die together with the circuit, but is preferably provided externally to allow design engineers to access and experimental fine-tuning of its value to suit any particular application. For a circuit 1 adapted to operate in the 2.5 GHz range, the combined value of capacitor 12a and the negative/positive charging current of tristate circuit 31 is preferably selected to provide a time-constant for the low-pass filter 12 of about 100 $\mu$S, corresponding to a cut-off frequency of filter 12 of about 10 kHz, such as between 1 KHz and 50 kHz. Practical values of capacitor 12a has been found to be within the range of about 1 nF to 50 nF, and practical negative/positive charging current values may be selected within the range of 20 $\mu$A to 500 $\mu$A.

As explained above, the time constant of low-pass filter 8 is preferably selected to significantly smaller, i.e. low-pass filter 8 has a substantially higher cut-off frequency than the cut-off frequency of low-pass filter 12. Preferably, the cut-off frequency of low-pass filter 8 is selected as being about 10–20 times higher than the cut-off frequency of low-pass filter 12. Accordingly, for operation in the 2.5 GHz range, a cut-off frequency of filter 8 of about 100 kHz, such as between 40 kHz and 2 MHz is selected. For higher or lower system operating frequencies e.g. 10 GHz or 622 MHz, these cut-off frequencies of low-pass filters 8 and 12 are preferably scaled substantially proportionally.

Further, it should be noted that in the shown circuit the two flip-flops 3 and 21 perform the same function, the signal SC at the output of the flip-flop 21 being identical to the signal which is led from the output of the flip-flop 3 to the laser driver 4 as the retimed data signal. One of the two flip-flops may thus be omitted. When two separate flip-flops are mentioned above it is for the purpose of clearness only.

Figure 3:
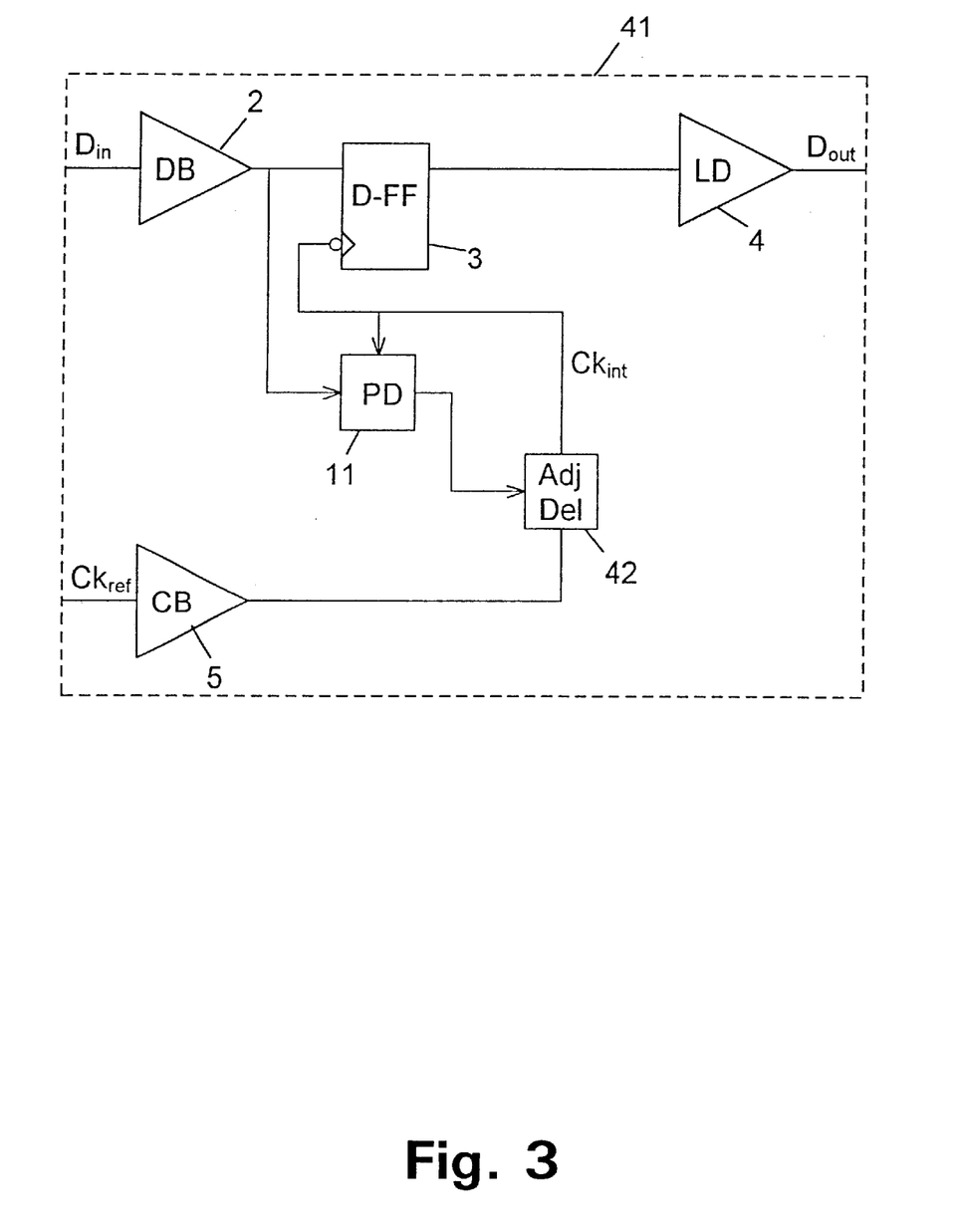
FIG. 3 shows a circuit according to a second embodiment of the invention.

FIG. 3 shows an alternative embodiment of the invention. As in FIG. 1 the data signal $D_{in}$ in the circuit 41 is led via a data buffer 2 to a flip-flop 3, in which the actual retiming takes place. The retimed data signal is then led to the laser driver 4, the output signal of which $D_{out}$, is connected to a laser diode (not shown). Here, the retiming is also effected by the data signal $D_{in}$ in the flip-flop 3 being sampled by an internally generated clock signal $Ck_{int}$ produced from the external clock signal $Ck_{ref}$. In this case, the internal clock signal $Ck_{int}$ is, however, not generated by means of a voltage-controlled oscillator. On the contrary, the external clock signal $Ck_{ref}$ is led directly from the clock signal buffer 5 to an adjustable delay unit 42 which is controlled by the output signal from the phase detector 11 which may, in this case as well, be structured as shown in FIG. 2. The delay unit 42 should be designed in such a way that a positive voltage from the detector 11 as a measure of the clock signal $Ck_{int}$ being too late as compared to the optimum sampling time will reduce the delay, whereas a negative voltage from the detector 11 as a measure of the clock signal $Ck_{int}$ being too early as compared to the optimum sampling time will increase the delay. Continuous adjustment of the clock signal $Ck_{int}$ is thus ensured, so that the sampling in the flip-flop 3 is performed in the centre of the bit period. It should be noted that in this embodiment it is necessary either that the external clock signal $Ck_{ref}$ has the same frequency as the internal $Ck_{int}$, i.e. the same frequency as the data signal, or that at least it has not got a frequency lower than said frequencies. A higher frequency which is a multiple of the frequency of the data signal may be compensated by inserting a dividing circuit after the buffer 5, but this will seldom be relevant.

Figure 4:
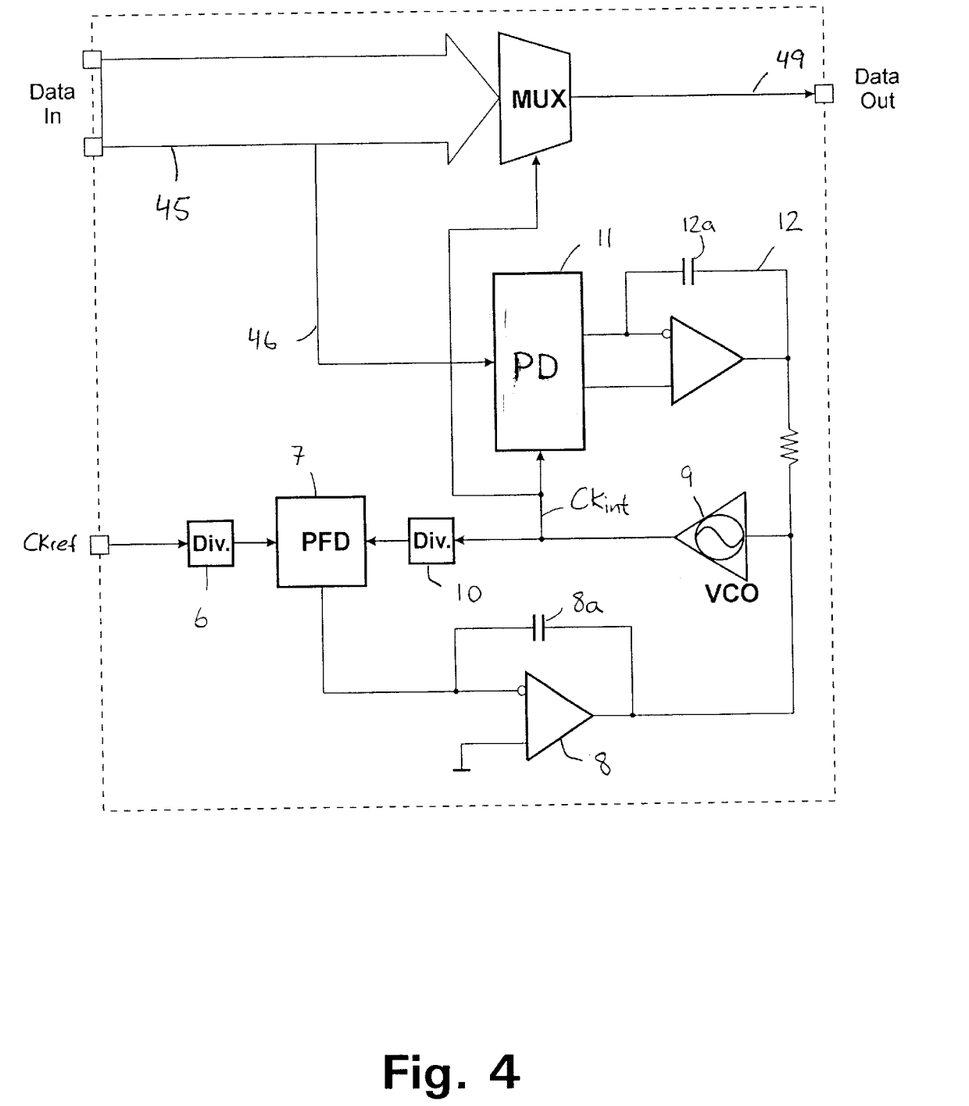
FIG. 4 shows a circuit according to a first embodiment of the invention, wherein a number of data channels are provided to the retiming circuit.

FIG. 4 shows another alternative embodiment of the invention. In FIG. 4, a retiming circuit according to FIG. 1 is shown, and the same reference signs denote the same features as on FIG. 1. A number of data channels is provided on the DATA bus 45. One digital data signal 46 of the one or several digital data signal(s) on the databus 45 is provided to the phase detector 11 for retiming of the digital data signal. The function of the retiming circuit comprising low pass filters 8 and 12, dividing circuits 6 and 10, phase frequency detector 7, voltage controlled oscillator 9, and phase detector 11 is described with respect to FIGS. 1 and 2. In FIG. 4, the internal clock signal $Ck_{int}$ is provided to the phase detector 11, and to the multiplexer 47 for multiplexing the incoming data signals and sampling these with reference to the internal clock signal $Ck_{int}$ and providing a multiplexed output 49.

Even though preferred embodiments of the present invention have been described and shown, the invention is not limited thereto, but may also be implemented according to other embodiments within the scope of the following claims.

What is claimed:

1. A method of retiming a digital data signal, the method comprising:

deriving an internal clock signal from an external clock signal;

detecting a phase or frequency difference between the internal clock signal and the external clock signal;

generating a first control signal based on the phase or frequency difference between the internal clock signal and the external clock signal;

detecting a phase difference between the digital data signal and the internal clock signal;

generating a second control signal based on the phase difference between the digital data signal and the internal clock signal;

filtering the second control signal with a first low-pass filter;

combining the filtered second control signal with the first control signal to create a steering signal;

filtering the steering signal with a second low-pass filter wherein the bandwidth of the second low pass filter is narrower than the bandwidth of the first low-pass filter; and adjusting a phase of the internal clock signal with respect to a phase of the digital data signal based on the filtered steering signal.

2. A method according to claim 1, wherein deriving the internal clock signal from the external clock signal comprises delaying the internal clock signal in dependence of the second control signal.

3. A method according to claim 1, further comprising phase locking or frequency locking the internal clock signal to the external clock signal by a phase locked loop or a frequency locked loop.

4. A method according to claim 3, further comprising applying the second control signal to a node of the phase locked or frequency locked loop.

5. A method according to claim 4, further comprising filtering the second control signal before being applying the second control signal to the node of the phase locked or frequency locked loop.

6. A method according to claim 1, wherein the bandwidth of the second low pass filter is between 10 and 20 times smaller than the bandwidth of the first low pass filter.

7. A method according to claim 1, wherein the cutoff frequency of the first low pass filter is between 40 kHz and 2 MHz.

8. A method according to claim 7, wherein the cutoff frequency of the first low pass filter is 100 kHz.

9. A retiming circuit comprising:

a phase comparator to generate a control signal indicating a phase difference between a digital data signal and an internal clock signal;

a first low-pass filter to filter the control signal;

a phase or frequency comparator to generate a signal indicating a phase or frequency difference between the internal clock signal and an external clock signal;

a second low-pass filter to filter the combination of the filtered control signal and the signal indicating a phase or frequency difference between the internal clock signal and the external clock signal wherein the bandwidth of the second low pass filter is narrower than the bandwidth of the first low-pass filter; and a voltage controlled oscillator to adjust the phase of the internal clock signal with respect to a phase of the digital data signal based on the filtered combination of the filtered control signal and an error signal.

10. The retiming circuit according to claim 9, further comprising a controllable time delay unit to derive the internal clock signal from the external clock signal by delaying the internal clock signal in dependence of the control signal.

11. A retiming circuit according to claim 9, further comprising a phase locked loop or frequency locked loop to receive and lock onto the external clock signal to provide the internal clock signal.

12. A retiming circuit according to claim 9, wherein the bandwidth of the second low pass filter is between 10 and 20 times smaller than the bandwidth of the first low pass filter.

13. The retiming circuit according to claim 9 wherein the digital data signal forms part of a data bus carrying several associated digital data signals.

14. The retiming circuit of claim 13 further comprising a multiplexer configured to receive the several associated digital data signals and to generate an outgoing serial digital data signal from the associated digital data signals, the multiplexer being clocked by a clock signal derived from the internal clock signal.

15. The retiming circuit according to claim 12 wherein the cutoff frequency of the first low pass filter is between 40 kHz and 2 MHz.

16. The retiming circuit according to claim 15 wherein the cutoff frequency of the first low pass filter is 100 kHz.

* * * * *